US006134330A

United States Patent [19]

De Poortere et al.

[11] Patent Number: 6,134,330

[45] Date of Patent: Oct. 17, 2000

[54] ULTRA BASS

[75] Inventors: Gerrit F. M. De Poortere; Catherine M. Polisset, both of Leuven, Belgium; Ronaldus M. Aarts, Eindhoven, Netherlands

[73] Assignee: U.S. Philips Corporation, New York, N.Y.

[21] Appl. No.: 09/390,842

[22] Filed: Sep. 7, 1999

[30] Foreign Application Priority Data

Sep. 8, 1998 [EP] European Pat. Off. .............. 98202998

[51] Int. Cl.[7] ........................................ H03G 3/00

[52] U.S. Cl. ........................................ 381/61; 381/98

[58] Field of Search ........................ 381/61, 98, 101, 381/120, 58, 59, 103

[56] References Cited

FOREIGN PATENT DOCUMENTS

| | | |
|---|---|---|
| 0546619A2 | 6/1993 | European Pat. Off. . |
| WO9742789 | 11/1997 | WIPO . |

*Primary Examiner*—Minsun Oh Harvey
*Attorney, Agent, or Firm*—Edward W. Goodman

[57] ABSTRACT

To improve the perceived audio signal, it is known to use a harmonics generator to create the illusion that the perceived audio includes lower frequency signal parts than really available. In addition to improving the perceived so called ultra bass signals (for example 20–70 Hz) also the signals in the frequency band between the ultra bass signal and the normal audio signal are improved.

5 Claims, 3 Drawing Sheets

ULTRA BASS

BACKGROUND OF THE INVENTION

1. Field of the Invention

The invention relates to an audio system comprising an input for receiving an audio signal and an output for supplying an output signal, processing means for processing the received audio signal, and enhancing means, whereby the enhancing means comprises selecting means for selecting a part of the audio signal, and an harmonics generator for generating harmonics of the selected part of the audio signal.

The invention further relates to means for enhancing the perceived low frequency response in an audio system.

2. Description of the Related Art

High fidelity reproduction of audio signals ideally requires sound transducers capable of reliably reproducing sound throughout the listening range of human beings. This has been determined to be 20–20,000 Hz. However, realistically, most high fidelity speaker systems are capable of reproducing sounds in the frequency range of 40–20,000 Hz. These high fidelity systems include small transducers (tweeters) for reproducing the high end of the frequency range, and relatively large transducers (woofers) for reproducing the low end of the frequency range. Naturally these speaker systems are large in size and take up a substantial amount of space in the listening area.

However, there are many customers who enjoy high fidelity sound but do not have the space for a high fidelity speaker system. Manufacturers recognizing this problem have been marketing compact audio systems with small speaker systems for these consumers. However, in view of the relatively small size of the speaker systems, these small speaker systems are not capable of reproducing audio frequencies in the range of 40–100 Hz. The consumer using these compact audio systems is then able to notice this deficiency and is then disappointed with the system.

Such an audio system is known from the European patent application EP-A0546619 (applicants reference PHA40624). Since the invention of the electrodynamics loudspeaker, there is a need for greater acoustical output, especially at low frequencies. Often however, for instance in television sets or portable audio sets, this acoustical output is severely limited by the small size of the loudspeakers. It is known that this dilemma can be solved by using a psycho-acoustic phenomenon often referred to as virtual pitch or missing fundamental, which evokes the illusion of a higher bass-response, while the loudspeaker does not radiate more power at these low frequencies. This illusion can be created by replacing low-frequency tones, which are present in the audio signal but can not be reproduced by a small loudspeaker, by harmonics of these tones. The harmonics now represent the low-frequency tones, the so-called ultra bass.

In the known audio system a low-frequency band of an audio signal is selected and supplied to enhancing means, in the form of a harmonics generator for generating harmonics of the selected signal. The generated harmonics are thereafter added to the audio signal. In this way, the low-frequency perception of the audio signal is improved. In the known audio system, a full wave rectifier is used as harmonics generator, which generates only even harmonics.

SUMMARY OF THE INVENTION

An object of the invention is to further improve the perceived low frequency audio signals.

To this end, a first aspect of the invention provides an audio system a described in the opening paragraph, characterized in that the enhancing means further comprises amplifying means and second selecting means for amplifying a second selected part of the audio signal.

By amplifying with amplifying means a second selected part of the audio signal, it is possible to amplify part of the bass signal which is not selected for the so-called ultra bass. Hereby the perceptions of the part of the audio signals, which are not improved with the harmonics generator, are improved. The ultra bass signals, with, for example, a frequency range of 20–70 Hz, are improved with the harmonics generator, and the part of the audio signal in the range 70–100 Hz is improved by amplifying in the amplifying means.

An embodiment of an audio system according to the invention is characterized in that the enhancing means comprises a series arrangement of the harmonics generator and the amplifying means.

A series arrangement of the harmonics generator and the amplifying means makes it possible to obtain a further improved perceived audio signal.

An embodiment of an audio system according to the invention is characterized in that the harmonics generator and/or the amplifying means are coupled to controlling means which is adapted to supply a control signal in dependence on the volume of the audio signal.

By making the amplification factor of the harmonics generator and/or of the amplifying means dependent on the volume of the audio signal, a dynamic control of the low frequency part of the audio signal is obtained. For audio signals with little low frequency signals, the harmonics generator and the amplifying means can amplify an obtained signal more than for low frequency signals with a higher low frequency signal level. In this way distortion can be prevented by higher-level low frequency audio signals.

An embodiment of an audio system according to the invention is characterized in that the amplifying means and the harmonics generator are coupled in parallel, the respective outputs are coupled to inputs of adding means, and to control means for detecting and controlling the output signals of the harmonics generator and of the amplifying means.

Herewith, the possibilities to control the output signal of the enhancing means are further improved.

BRIEF DESCRIPTION OF THE DRAWINGS

The invention and additional features, which may optionally be used to implement the invention to advantage, will be apparent from and elucidated with reference to the examples described below hereinafter and shown in figures, in which.

DESCRIPTION OF THE PREFERRED EMBODIMENTS

Corresponding elements will be referred to with corresponding reference signs throughout the figures.

Figure 1:
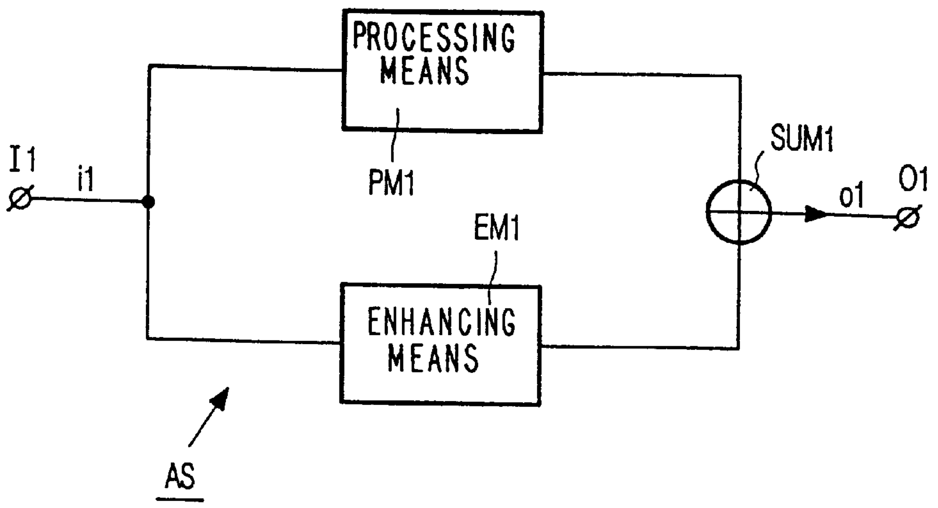
FIG. 1 PRIOR ART
FIG. 1 shows a schematic embodiment of an audio system of the prior art.

FIG. 1 shows a schematic embodiment of an audio system AS1 of the prior art, comprising processing means PM1 and enhancing means EM1. The audio system further comprises an input I1 for receiving an audio input signal i1 and an output O1 for supplying an audio output signal o1, for example, to be supplied to loudspeakers (not shown). The processing means and the enhancing means are both coupled to the input for receiving the audio input signal. The outputs of the processing means and of the enhancing means are coupled to respective inputs of summing means SUM1 for summing the processed signals and supplying the combined signal to the output O1.

The operation of the audio system AS1 is as follows. The received input signal i1 is processed in the processing means PM1 as is normally done in an audio system, which is known to the man skilled in the art and needs no further explanation. The enhancing means EM1 selects a frequency range from the input signal i1, which has to be processed separately, and afterwards added in the adding means AM1 to the processed signal. The prior art enhancing means comprises a harmonics generator for generating the so-called ultra bass signal.

In the following the operation of the enhancing means according to the invention will be described in more detail with reference to the further figures.

Figure 2:
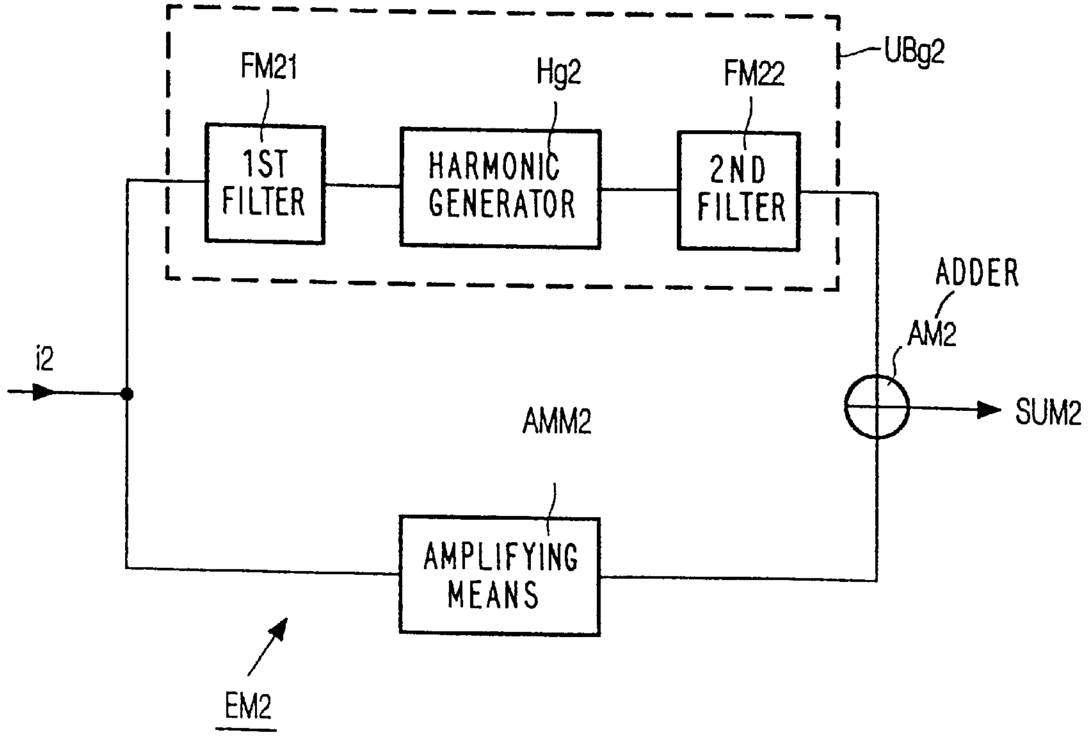
FIG. 2 shows a first schematic embodiment of enhancing means according to the invention.

FIG. 2 shows a first embodiment of the enhancing means EM2 according to the invention. In this embodiment[]the enhancing means comprises an ultra bass generator UBG2 having an harmonics generator HG2 coupled via first filter means FM21 to the input of the enhancing means EM2 and coupled via second filter means FM22 to adding means AM2 at the output of the enhancing means. The output of the adding means AM2 can be coupled to the summing means SUM2 of the audio system (not shown, see FIG. 1). Amplifying means AMM2 is coupled in parallel to the harmonics generator HG2 and the filter means FM21 and FM22. The output of the amplifying means is coupled to the other input of the adding means AM2.

The harmonics generator HG2 generates harmonics of the lower frequency range of the signal, for example 20–70 Hz, so-called ultra bass, to improve the perceived low frequency signals.

The amplifying means is implemented to amplify part of the bass signal, which is not handled in the harmonics generator HG2. For example, the amplifying means amplifies the signals in the frequency band 70–100 Hz, to improve the perception of that part of the signal, and thereby the total perceived audio signal.

Figure 3:
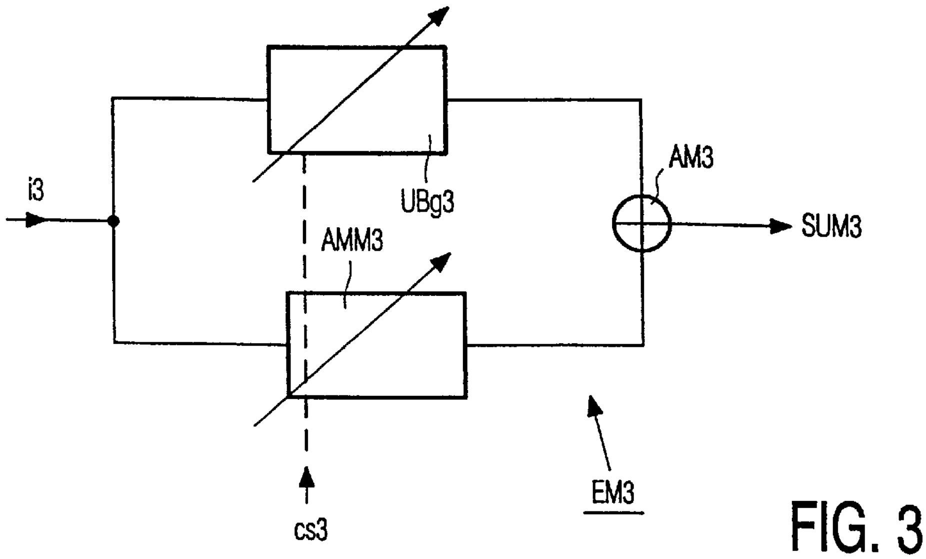
FIG. 3 shows a second schematic embodiment of enhancing means according to the invention.

FIG. 3 shows a second embodiment of enhancing means EM3 comprising amplifying means AMM3 and an ultra bass generator UBG3, whereby the amplifying means and the ultra bass generator are controlled by a (mechanical) control CM3, means (not shown). The control means supply a control signal cs3 to the amplifying means and to the ultra bass generator for controlling the amplification factor(s) of both in dependence on, the amplitude level of the audio input signal. By making the operation of the ultra bass generator and of the amplifying means volume dependent distortion at high input level will be overcome.

Figure 4:
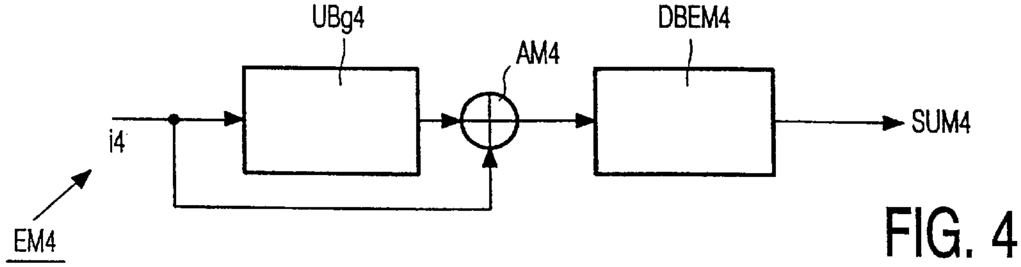
FIG. 4 shows a third schematic embodiment of enhancing means according to the invention.

FIG. 4 shows a third embodiment of enhancing means EM4 comprising a series-arrangement of an harmonics (for example ultra bass) generator UBG4 and dynamic bass enhancement means DBEM4 as amplifying means.

The signal is supplied to the ultra bass generator UBG4 for generating harmonics of the low frequency signal part. The output of the UBG4 is supplied to adding means AM4 that receives, at the other input, the input signal i4. The combined signal is supplied to the so-called dynamic bass enhancement means DBEM4 for amplifying the received signal in dependence of the volume of the signal. Hereby, a distortion of the output signal by a high-level low frequency signal will be further overcome.

Figure 5:
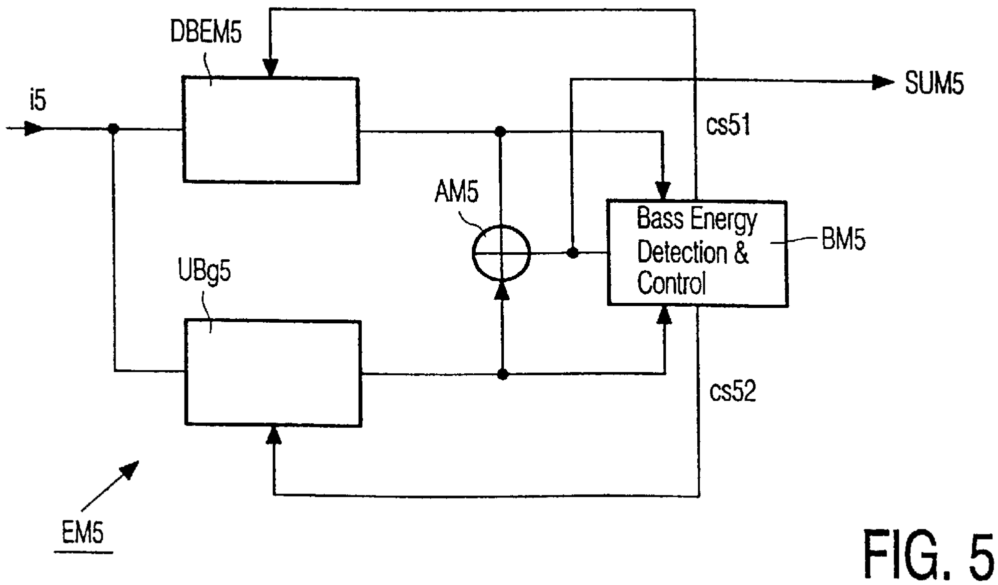
FIG 5 shows a fourth schematic embodiment of enhancing means according to the invention.

FIG. 5 shows a fourth embodiment of enhancing means EM5 comprising dynamic bass enhancement means DBEM5 (as amplifying means) and the ultra bass generator UBG5 (as harmonics generator) in parallel. The outputs are coupled to adding means AM5 for adding these output signals. The output of the adding means is supplied to SUM5 (see FIG. 1). Further this output signal is supplied to bass generator energy control means BM5 for detecting the energy of the bass signal and to supply a first control signal cs51 to the dynamic bass enhancement means DBEM5 and a second control signal cs52 to the ultra bass generator UBG5. The bass energy means BM5 also receives the output signals of the dynamic bass enhancement means DBEM5 and of the ultra bass generator UBG5 as inputs. Hereby, the performance of the enhancement means is further improved.

Figure 6:
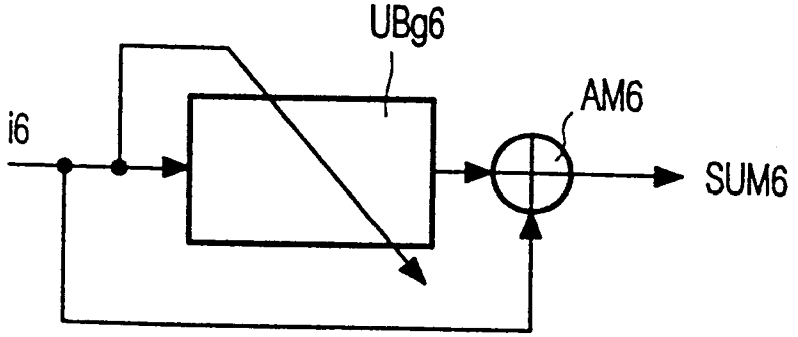
FIG. 6 shows a schematic embodiment of an ultra bass generator according to the invention.

FIG. 6 shows an embodiment of an ultra bass generator UBG6 (as harmonics generator), whereby the generated ultra bass signal depends on the received input signal and the generated ultra bass signal is added in adding means AM6 to the input signal. Hereby, the harmonics generator is made (input) signal dependent.

Figure 7:
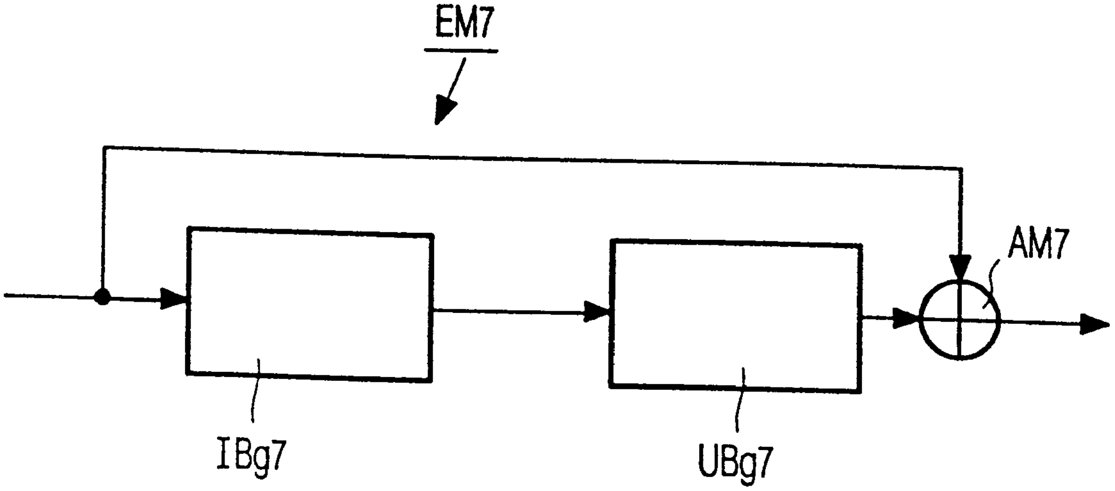
FIG. 7 shows a fifth schematic embodiment of enhancement means according to the invention.

FIG. 7 shows a fifth embodiment of enhancing means EM7 comprising a series-arrangement of a so called infra bass generator IBG7 and the so called ultra bass generator whereby the output signal of the ultra bass generator UBG7 is added in the adding means to the input signal. An infra bass generator creates lower signal frequencies than are available in the input signal, whereas the ultra bass generator creates harmonics of the lower frequency input signal to create the illusion of lower frequencies than the input signal has.

It is to be noticed that above the invention has been explained on the basis of some embodiments. The different embodiments can be combined to obtain the different advantages. For example, is it possible to combine the embodiment of the ultra bass generator UBG6 (FIG. 6) with the embodiment of the enhancement means (for example FIG. 5).

What is claimed is:

1. An audio system comprising:

an input for receiving an audio signal and an output for supplying an output signal;

processing means coupled to the input for processing the received audio signal; and enhancing means, wherein the enhancing means comprises:

first selecting means for selecting a first part of the audio signal; and an harmonics generator for generating harmonics of the first part of the audio signal, characterized in that the enhancing means further comprises:

second selecting means for selecting a second part of the audio signal, said second part being different from said first part; and amplifying means for amplifying said second part of the audio signal.

2. The audio system as claimed in claim 1, characterized in that the enhancing means comprises a series arrangement of the harmonics generator and the amplifying means.

3. The audio system as claimed in claim 1, characterized in that the enhancing means further comprises controlling means for supplying a control signal in dependence on a volume of the audio signal, said control signal being applied to the harmonics generator and/or the amplifying means.

4. The audio system as claimed in claim 1, characterized in that the amplifying means and the harmonics generator are coupled in parallel, and the enhancing means further comprises adding means having inputs coupled to respective outputs of said amplifying means and the harmonics generator, and control means having inputs coupled to the inputs and an output of said adding means, and outputs coupled to control inputs of said amplifying means and said harmonics generator, said control means detecting and controlling the output signals of the harmonics generator and of the amplifying means.

5. An enhancing circuit for use in an audio system, said enhancing circuit comprising:

an input for receiving an audio signal;

first selecting means for selecting a first part of the audio signal;

an harmonics generator for generating harmonics of the first part of the audio signal;

second selecting means for selecting a second part of the audio signal, said second part being different from said first part; and amplifying means for amplifying said second part of the audio signal.

* * * * *